United States Patent [19]

Takahashi et al.

[11] Patent Number: 5,479,106
[45] Date of Patent: Dec. 26, 1995

[54] ELECTRO-OPTIC VOLTAGE DETECTOR

[75] Inventors: Hironori Takahashi; Shinichiro Aoshima; Yutaka Tsuchiya, all of Hamamatsu, Japan

[73] Assignee: Hamamatsu Photonics K.K., Hamamatsu, Japan

[21] Appl. No.: 313,805

[22] Filed: Sep. 28, 1994

[30] Foreign Application Priority Data

Sep. 28, 1993 [JP] Japan .................. 5-241626

[51] Int. Cl.⁶ ...................... G01R 31/28; G01R 31/00
[52] U.S. Cl. .................................... 324/753; 324/96
[58] Field of Search ........................... 324/158.1, 73.1, 324/96, 750, 752, 753; 359/245, 249, 248; 439/482

[56] References Cited

U.S. PATENT DOCUMENTS

| | | |
|---|---|---|
| 4,446,425 | 5/1984 | Valdmanis et al. |
| 4,618,819 | 10/1986 | Mourou et al. |
| 4,891,580 | 1/1990 | Valdmanis . |
| 4,996,475 | 2/1991 | Takahashi et al. |
| 5,041,783 | 8/1991 | Ohta et al. .................. 324/96 |
| 5,394,098 | 2/1995 | Meyrueix et al. ............ 324/96 |

FOREIGN PATENT DOCUMENTS

| | | |
|---|---|---|
| 0297562 | 1/1989 | European Pat. Off. . |
| 0299432 | 1/1989 | European Pat. Off. . |
| 0306359 | 3/1989 | European Pat. Off. . |
| 0357438 | 3/1990 | European Pat. Off. . |
| 0541139 | 5/1993 | European Pat. Off. . |
| 63-133068 | 6/1988 | Japan . |
| 429344 | 1/1992 | Japan . |

OTHER PUBLICATIONS

Valdmanis et al, "Subpicosecond Electrooptic Sampling: Principles and Applications", IEEE Journal of Quantum Electronics, vol. QE-22, No. 1, Jan. 1986, pp. 69–78.

Kolner et al, "Electrooptic Sampling: Principles and Applications", IEEE Journal of Quantum Electronics, vol. QE-22, No. 1, Jan. 1986, pp. 69–78.

Kolner et al, "Electrooptic Sampling in GaAs Integrated Circuits", IEEE Journal of Quantum Electronics, QE-22, No. 1, Jan. 1986, pp. 79–93.

Valdmanis, "Electro-Optic Measurement Techniques for Picosecond Materials, Devices, and Integrated Circuits", Semiconductors and . . . , vol. 23, pp. 135–219.

Patent Abstracts of Japan, vol. 17, No. 231 (P-1532) May 11, 1993 & JP-04 359 162 (Fujitsu) Dec. 11, 1992.

Primary Examiner—Vinh P. Nguyen
Attorney, Agent, or Firm—Cushman Darby & Cushman

[57] ABSTRACT

To provide an E-O probe which can measure a voltage distribution in a fine region while enlarging it. A grounded, transparent electrode 2 and an electrooptic member 3 such as $LiTaO_3$ are successively fixed to and below a support 1. There are a plurality of conical, conductive members 5a–5e arranged below a reflection film 4 in such a manner that the bottom surfaces thereof are fixed to the lower surface of the reflection film 4 and that the lower ends thereof project downward. Spaces between the plural, linear, electric needles 5a–5e become narrower toward a measured object located below them, whereby voltages in a fine region in the measured object can be guided as enlarged to the electrooptic member 3.

16 Claims, 8 Drawing Sheets

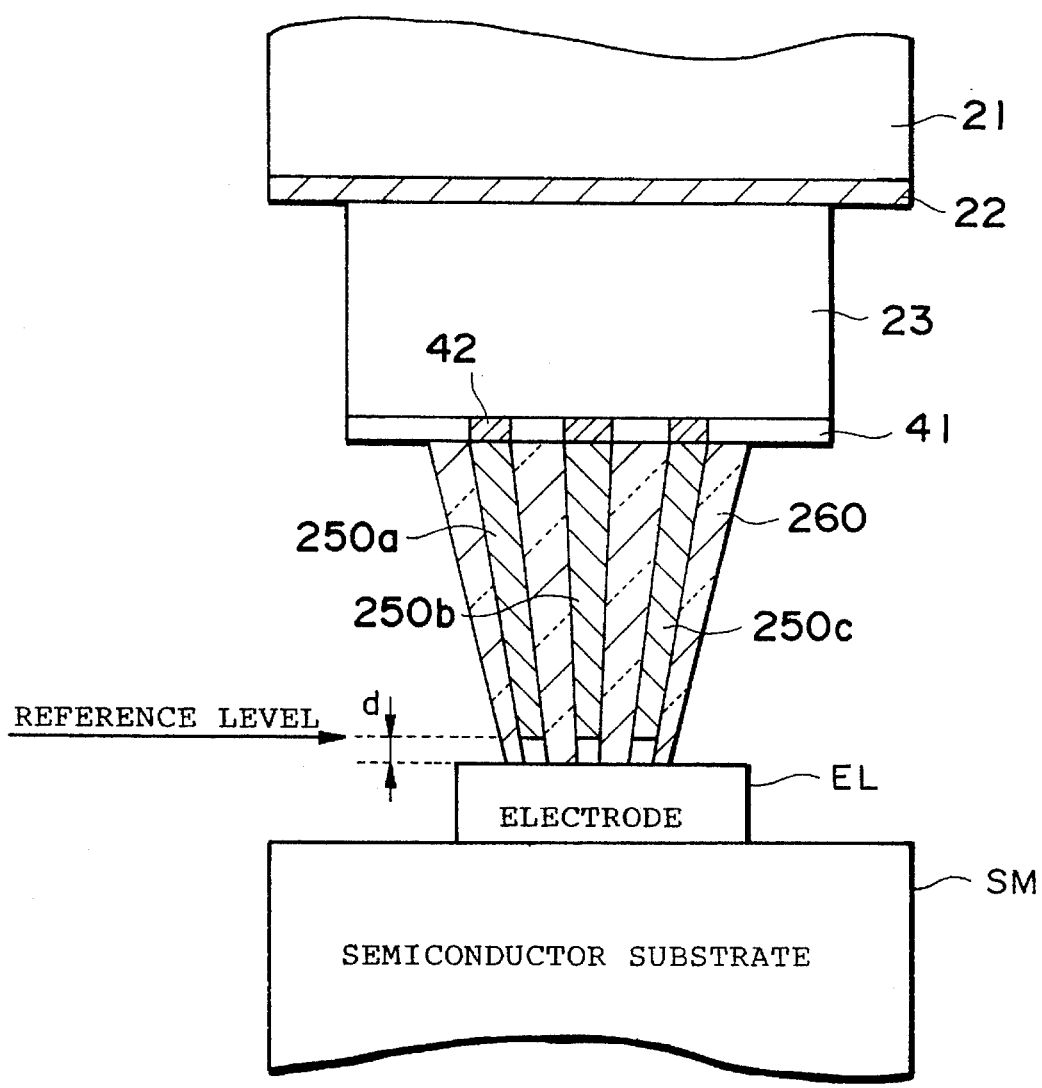

ELECTRO-OPTIC VOLTAGE DETECTOR

BACKGROUND OF THE INVENTION

1. Field of the Invention

The present invention relates to an E-O (Electro-Optic) probe and electro-optic voltage detector which can measure a voltage or voltage waveforms on electrical conductors.

2. Related Background Art

With an increase in fineness of semiconductor integrated circuits, potential measuring apparatus (electro-optic voltage detector) using the E-O probe utilizing the electrooptic effect are in the limelight as apparatus for accurately measuring voltage signal waveforms of elements in such integrated circuits.

The potential measuring apparatus using the E-O probe are apparatus in which an electrooptic crystal is opposed to a measured object, the electrooptic crystal is irradiated with a light beam of linear polarization or circular polarization from the side opposite to the measured object, and the light beam reflected by the opposed end face (to the measured object) of the electrooptic crystal is led through an analyzer to enter a photodetector, whereby the beam is detected.

The technology related to such E-O probe is described, for example, in Japanese Laid-open patent Application No. 4-29344.

SUMMARY OF THE INVENTION

E-O probes may be so arranged that conductive members fixed to a electrooptic crystal on the measured sample surface side are made in the needle shape. In this technology using this needle shape conductive member, electric fields induced by potentials of wires or electrodes formed on a semiconductor substrate are guided with high spatial resolution through the needle shape conductive member to the electrooptic crystal. When a multitude of conductive members are made over the entire surface of electrooptic crystal, in case of a plurality of portions being measured, the total measurement time is reduced.

However, if the plurality of conductive members are brought close to the measured object to measure a potential distribution in a fine region in the measured object with scan of laser light beam on the plural conductive members, the spatial resolution is very poor, because reflected light from a certain conductive member is measured simultaneously with reflected light from neighboring conductive members, using the laser beam with large beam size.

Thus, high resolution measurement is impossible if the spaces between the wires or needlelike conductive members are narrower than the beam size. Further, high resolution measurement is impossible if a high resolution is desired for the potential distribution in the fine region in the wiring.

Of course, thinning of the beam size can reduce interference from neighboring conductive members, but the potential distribution cannot be measured for devices of submicron order, because the beam size cannot be a size smaller than the submicron order. That is, the convergence limit of beam size is determined by the numerical number of a lens for converging the beam and the wavelength of the beam.

The present invention has been accomplished in view of such problems, and an object of the present invention is to provide an E-O probe and electro-optic voltage detector (this is an apparatus comprising the E-O probe) which can measure potentials at plural points in a fine region while enlarging them.

To solve the above problems, the present invention is directed to an E-O probe which comprises an electrooptic member changing a refractive index thereof in accordance with an electric field applied thereto, and a plurality of needlelike, conductive members bases of which are fixed to a surface of the electrooptic member, wherein each space on a side of the bases between the plurality of needlelike, conductive members is greater than each space on a side of the tips between the needlelike, conductive members.

According to such an arrangement, electric fields corresponding to potentials in the fine region in the measured object are induced as enlarged in a wide region in the electrooptic member through the needlelike, conductive members. Since the electrooptic member changes its refractive index depending upon the potential, the incident light into the electrooptic member is changed in polarization state upon reflection in accordance with the potentials in the fine region in the measured object.

In addition, the potentials induced by the fine region in the measured object are enlarged to be transmitted to the electrooptic member, and, therefore, detecting the light changed in polarization state by the electrooptic member, the potential distribution can be measured for a smaller region in the measured object than the convergence limit of the incidence laser light beam into the E-O probe. The space between the bases of the needlelike conductive members is greater than the incident laser beam size.

Also, since the tip of the plurality of needlelike, conductive members are located on a substantially same plane, the needlelike, conductive members can be brought uniformly close to the fine region in the measured object. Then, if the needlelike, conductive members are buried in a retaining portion made of an insulator member, the needlelike, conductive members can not only be reinforced, but also electrically insulated from each other.

Especially, when the tip of the plurality of needlelike, conductive members are located on a substantially same plane, and a surface of the insulator member facing to the sample is parallel to the sample surface or has a plane, the needlelike, conductive members can be brought uniformly close to the fine region in the measured object only by making contact the tip with the sample surface.

Further, if a light reflection film is interposed in portions where the bases of the plural needlelike, conductive members are fixed to the electrooptic member and a light shield film is formed on exposed surfaces around fixed surfaces of the bases, the intensity of reflection can be enhanced for reflected light from the portions of the electrooptic member where the needlelike, conductive members are fixed, and at the same time the interference can be prevented with reflected light from the neighboring needlelike, conductive members.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 8 is a cross sectional view of an E-O probe the fifth embodiment.

DESCRIPTION OF THE PREFERRED EMBODIMENTS

Figure 1:
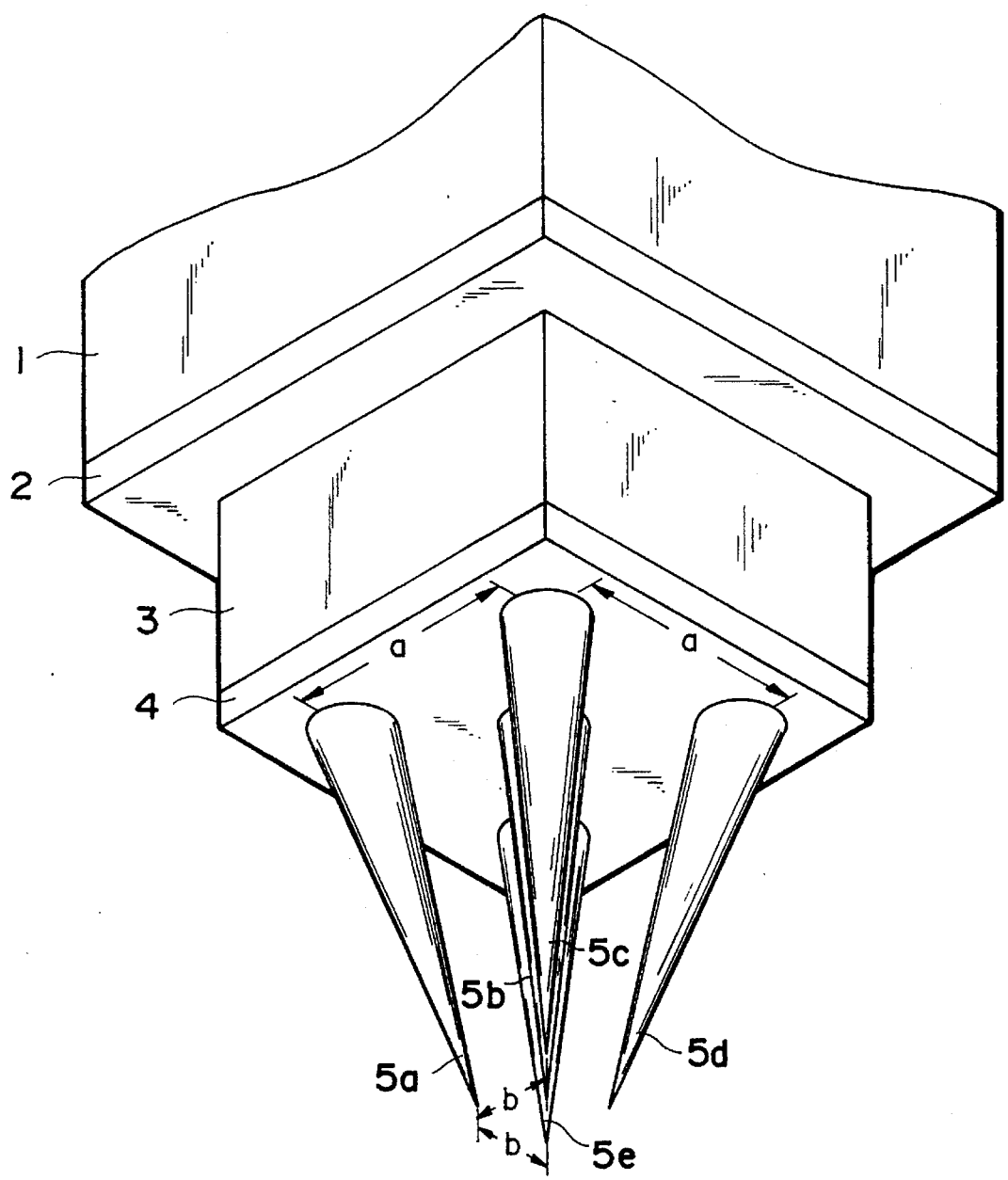
FIG. 1 is a perspective view of an E-O probe of the first embodiment of the present invention.

The present invention will be described in detail as to preferred embodiments of Electro-Optical voltage detector having E-O probe with reference to the accompanying drawings. In the description same elements will be denoted by same reference numerals or symbols, and redundant description will be omitted.

First Embodiment

FIG. 1 is a perspective view to show the structure of an E-O probe of the first embodiment of the present invention.

This E-O probe comprises a transparent support member 1, grounded transparent electrode 2, electrooptic member 3, reflection film 4, and first through fifth needlelike, conductive members 5a–5e as shown in FIG. 1.

The support member 1 is made of a transparent material such as glass. The quarts glass support 1 is in the size of 300×300×200 μm. The transparent electrode 2 is made of Indium-Tin-Oxide (ITO), and fixed to the support member 1. The electrooptic member 3 is made of a material such as ZnTe, the electrooptic member 3 is fixed to the transparent electrode 2, and the thickness of the electrooptic member 3 is some ten μm. The reflection film 4 is a dielectric multilayer film, and fixed to the electrooptic member 3. Below the reflection film 4, a plurality of (five in the drawing) conical, conductive members (electric needles) 5a–5e are fixed to the lower surface of the reflection film 4 on base surfaces of the members 5a–5e so that the lower ends thereof project downward.

Needle spaces between the plurality of conical, electric needles 5a–5e decrease toward a measured device (measured device 112 shown in FIG. 2) located below the needles, whereby they can guide potentials in a fine region in the measured device to the electrooptic member 3 while enlarging them.

Further, the lower end portions (second end portion) of the electric needles 5a–5e are formed in a substantially same plane, so that they can accurately measure an in-plane distribution of the potentials in the fine region measured.

Other materials for the electrooptic member 3, than above ZnTe, may be $LiNbO_3$, BSO, GaAs, CdTe, $LiTaO_3$, etc.

When the electric needles 5a–5e in the E-O probe as so arranged are brought close to the measured device (measured device 112 shown in FIG. 2), electric fields induced by potentials in the measured device are transmitted through the electric needles 5 to the electrooptic member 3 to change the refractive index of the electrooptic member 3 by the Pockels effect.

On this occasion, letting laser light of linear polarization, circular polarization, or elliptical polarization enter the electrooptic member 3 from above the support member 1, the polarization state of the laser light is changed by the change of refractive index according to the potentials in the measured device. Then the laser light is reflected by the reflection film 4 attached to the lower surface of the electrooptic member 3 to be outgoing upward the support 1. In this connection, the electric needles 5 may be set in contact with the measured object in measurement.

Here, let us consider a case that potentials of electrodes in an integrated circuit are measured using the E-O probe provided with such electric needles 5a–5b. The minimum width W of electrodes (not shown) of the integrated circuit is 0.5 μm, for example. Thus, letting "b" be the spaces at the lower end points (second end portions) between the electric needle 5c (first needlelike member) and needle 5d (second needlelike member) shown in FIG. 1, it is necessary that "b" be set to about W–0.5 μm. Further, assuming that the numerical aperture NA of an objective lens (objective lens 110 shown in FIG. 2) set above the electrooptic member 3 is 0.4, the diameter $a_0$ of a focused beam is given by the following formula from the diffraction limit of light.

$$a_0 = 2 \lambda / (\pi \cdot NA) \text{ (where } \pi \text{ is the circular constant)}$$

Supposing laser light of wavelength $\lambda=1$ μm is focused by the objective lens then to enter the electrooptic member 3, the diameter $a_0$ of the focused beam becomes 1.6 μm from the above formula. Namely, the convergence limit of the light is thus not less than 1.6 μm.

Accordingly, in order to remove the effect of signals from neighboring electric needles 5a–5e, it is necessary that a=2 μm or more where "a" is the spaces on the bottom surface between the electric needle 5c and 5d shown in FIG. 1. That is, the spaces "a" on the bottom surface between the electric needle 5c and needle 5d need to be set to about four or more times larger than the spaces "b" at the lower end points, more precisely to $2\lambda/(\pi \cdot NA \cdot W)$ or more times.

Figure 2:
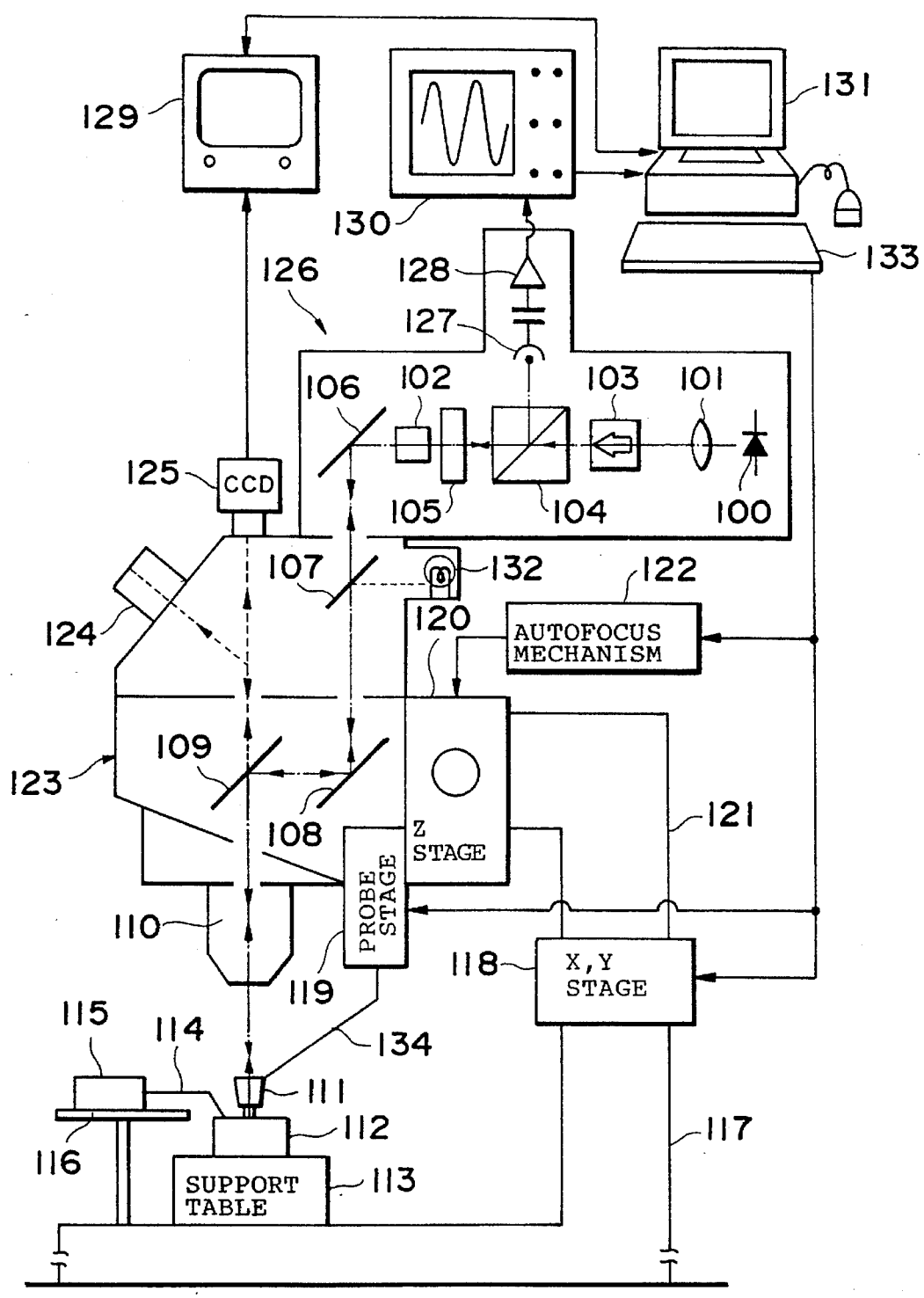
FIG. 2 is a diagrammatic drawing of a potential measuring apparatus using the E-O probe of the first embodiment of the present invention.

FIG. 2 shows the structure of an apparatus of an E-O probing system (electro-optic voltage detector) which detects the laser light first incident into the E-O probe in FIG. 1 and then outgoing upward from the support member 1 to measure potentials in the measured device 112. Next described is the structure of the apparatus shown in FIG. 2 together with the operation thereof.

The apparatus electro-optic voltage detector comprises a main body 117, a device-to-be-measured support table 113, a movable stage (118, 119, 120), an optical unit 126 and a microscope unit 123.

The device-to-be measured support table 113 is attached to the main body 117, and the support table 113 faces to the first and second needlelike members 5c, 5d show in FIG. 1.

The movable stage (118) is attached to the main body 117 for moving the first and second needlelike members (5a–5e) shown in FIG. 1 related to the support table 113.

The optical unit 126 is attached to the main body 117. The optical unit 126 has a laser light source 100, a wave plate 105, a photodetector 127 and a polarization beam splitter 104. The laser light source 100, wave plate 105 and polarization beam splitter 104 are so arranged that an incident laser beam from the laser light source 100 is made incident through the polarization beam splitter 104 and said wave plate 105 in a first direction. Further, the wave plate 105, photodetector 127 and polarization beam splitter 104 are so arranged that a reflection laser beam from the wave plate 105, travelling in a second direction is reflected by the polarization beam splitter 104 and is made incident on the photodetector 127.

The microscope unit 123 is attached to the main body 117. The microscope unit 123 has an objective lens 110. The objective lens 110 is so arranged that the incident laser beam is made incident through the objective lens 110 and is made incident on the reflection film 4 shown in FIG. 1. Further, the objective lens 110 is so arranged that the reflection laser beam reflected by the reflection film 4 is made incident thorough the objective lens 110 and is made incident thorough the wave plate 105 in the second direction. Next, the structure of the apparatus shown in FIG. 2 is explained more precisely.

This E-O probing system is an apparatus for measuring potentials in a measured device 112 on the support table 113 set on an upper surface of the stationary portion 117 of the main body in such a manner that laser light emitted from an optical unit 126 is made to fall on the above E-O probe 111 set above and near the measured device and that reflected laser light from the E-O probe 111 is detected by the photodetector 127 in the optical unit 126.

There are the laser light source 100, a lens 101, an optical isolator 103, the polarization beam splitter 104, the wave plate 105, a deflecting element 102, and a mirror 106 sequentially arranged in the optical unit 126. The optical unit 126 has a light shielding case LS1, and these elements 100, 101, 103, 104, 105, 106 are arranged in the light shielding case LS1. First, the laser light emitted from the laser light source 100 is made incident through the lens 101 and the optical isolator 103 which allows the light to pass only in one direction, into the polarization beam splitter 104.

Then the light incident into the polarization beam splitter 104 is made incident through the ⅛ wave plate 105 into the deflecting element 102. The deflecting element 102 is an element for temporally changing the direction in which the laser light is projected. Applicable elements as the deflecting element 102 are, for example, a mechanical element including a combination of two rotary polygon mirrors which effects two-dimensional scan of beam by rotating the mirrors, an element utilizing the electrooptic effect, such as a Pockels modulator, etc. The laser light thus changed in the direction of projection is made to fall on the mirror 106, whereby the optical path thereof is changed.

The laser light thus changed in the optical path by the mirror 106 is then made incident into the microscope unit 123 disposed below the optical unit 126. The laser light incident into the microscope unit 123 is then made incident via a dichroic mirror 107, a mirror 108, and a dichroic mirror 109 set on the optical path and in the microscope unit 123, into an objective lens 110.

The laser light converged by the objective lens 110 is made incident into the E-O probe 111 (the E-O probe 111 is precisely shown in FIGS. 1, 4, 5, 8), where the polarization state thereof is changed in accordance with potentials in the measured device 112 and then the laser light is reflected upward the E-O probe 111. The outgoing laser light travels in the reverse direction to the incident path to pass through the ⅛ wave plate 105, which provides the light with a bias-like phase difference.

Then the light travels via the polarization beam splitter 104, where the change in polarization state is converted into a change in intensity. Then the light enters a photodetector 127 (for example, a PIN photodiode). Here, the ⅛ wave plate 105 provides the light with a phase difference of a quarter of the wavelength during the double passage of go and return. The laser light detected by the photodetector 127 is converted into an electric signal, and the electric signal is amplified by an amplifier 128 to be put into a digital oscilloscope 130.

The electric signal (photo intensity signal) put into the digital oscilloscope 130 is displayed on the digital oscilloscope 130 and also put into a computer (signal convertor) 131 to be converted into potentials (voltages) in the measured device 112. As described, the potentials in the measured device 112 are thus measured.

A drive voltage is supplied from a manipulator 115 on a control table 116 through an electric needle 114 to the measured device 112. Images of the measured device 112 and E-O probe 111 are observed on a monitor 129 connected with a CCD 125 in such a manner that light from an illumination light source 132 in the microscope unit 123 is guided via the dichroic mirror 107, the mirror 108, and the dichroic mirror 109 and through the objective lens 110 to fall on the surface of the measured device 112 and that reflected light is let to pass through the dichroic mirror 109 to impinge on the CCD 125 located on the transmission path, so that the images are picked up thereby.

The CCD 125 is a visible light camera (TV camera) in case of the E-O probe 111 being a crystal transparent to part of the visible region, such as ZnTe, or an infrared camera in case of the E-O probe 111 being a crystal transparent to the infrared region, such as GaAs.

Also, the monitor 129 includes a built-in image memory, so that it can store the input images as still images or display them on a display of the computer 131 connected with the monitor 129. These images can be observed by the bare eyes through eyepieces 124 located on the optical path of the transmitted light through the dichroic mirror 109.

Observing such images, the E-O probe 111 can be moved to the measured region in the measured device 112 by the following moving mechanism.

The E-O probe 111 is fixed to the probe stage 119 through a support needle 134 connected with the grounded, transparent electrode in the E-O probe 111. The probe stage 119 is arranged as vertically slidable, so that it can move the E-O probe 111 in the vertical directions (directions along the Z-axis) in the drawing. The probe stage 119 is fixed to the microscope unit 123, and the microscope unit 123 is also arranged as slidable in the directions along the Z-axis by the Z-axis stage 120 supporting it.

The Z-axis stage 120 is fixed to the XY axis stage 118 through a movable portion 121 of the main body, so that it can horizontally move the E-O probe 111 in the XY plane (plane perpendicular to the Z-axis). By the above arrangement, the E-O probe 111 can be moved in a three-dimensional space, and the focal length of the microscope unit 123 can be adjusted independently of it.

Connected with the Z-axis stage 120 is an automatic focusing mechanism for automatically focusing the microscope unit 123 by analyzing the contrast of the image displayed on the computer 131. When the operator gives the computer 131 an input through a keyboard 133, the XY axis stage 118 and probe stage 119 are made to slide under an instruction from the computer 131 so as to move the E-O probe 111 in the directions along the XY axes and in the directions along the Z-axis, whereby the E-O probe 111 can be horizontally moved to above the measured region and be then brought close thereto at a desired proximity distance.

Figure 3:
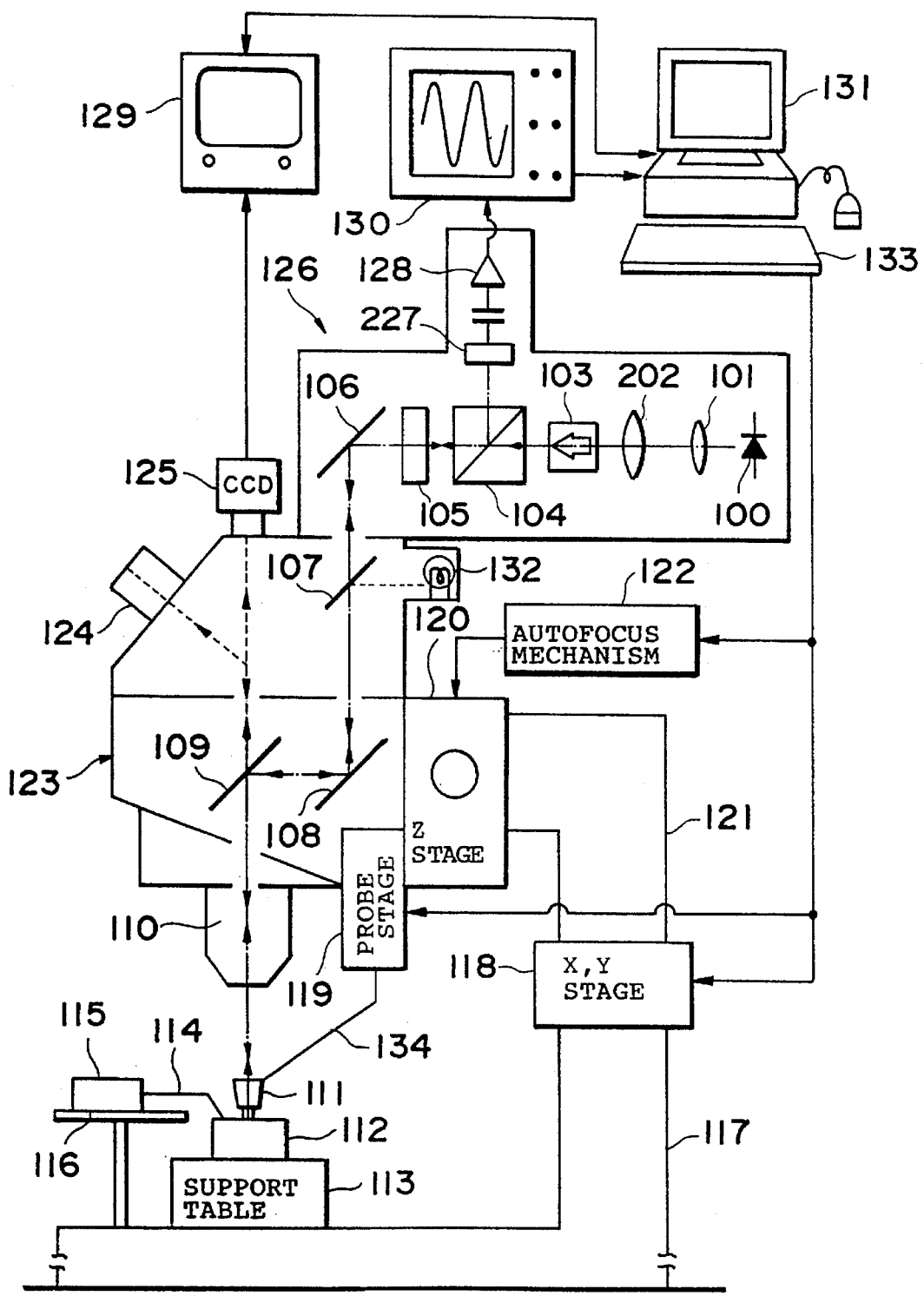
FIG. 3 is a diagrammatic drawing of a potential measuring apparatus using the E-O probe of the first embodiment of the present invention.

FIG. 3 shows another arrangement obtained by modifying the E-O probing system of FIG. 2 in such a manner that in place of the deflecting element 102 a lens 202 is disposed between the lens 101 and the light isolator 103 and that photodetectors 227 two-dimensionally arranged replace the photodetector 127 (for example a photodiode array or CCD image sensor). This arrangement makes the laser light emitted from the laser light source 100 enlarged and collimated. Guiding the enlarged and collimated light into the E-O probe 111, the information on the electric field induced in the electric needles 5a–5e of FIG. 1 can be put in parallel into the photodetectors 227 two-dimensionally arranged.

The reflected light including the information on the electric field from each electric needle 5a–5e is processed in the same manner as in the apparatus of FIG. 2, whereby the potentials in the measured device 112 can be measured. As described, the apparatus of FIG. 3 can measure a distribution of electric field in the measured device 112 in parallel.

Since the electric needles 5a–5e of FIG. 1 radially spread from the measured device 115 toward the electrooptic member 3 and are connected to the broad region of the electrooptic member, the potential information from the electric needles 5a–5e, included in the reflected light, can be readily separated from each other to be put into the photodetectors 227 two-dimensionally arranged.

According to the first embodiment as described above, the spaces between the electric needles 5a–5e are made narrower toward the lower ends thereof, so that the potentials in the measured device can be measured as enlarged. Also, since the lower ends of the electric needles 5a–5e are formed on the same plane, the in-plane distribution of potentials in the measured device can be accurately measured.

Second Embodiment

Figure 4:
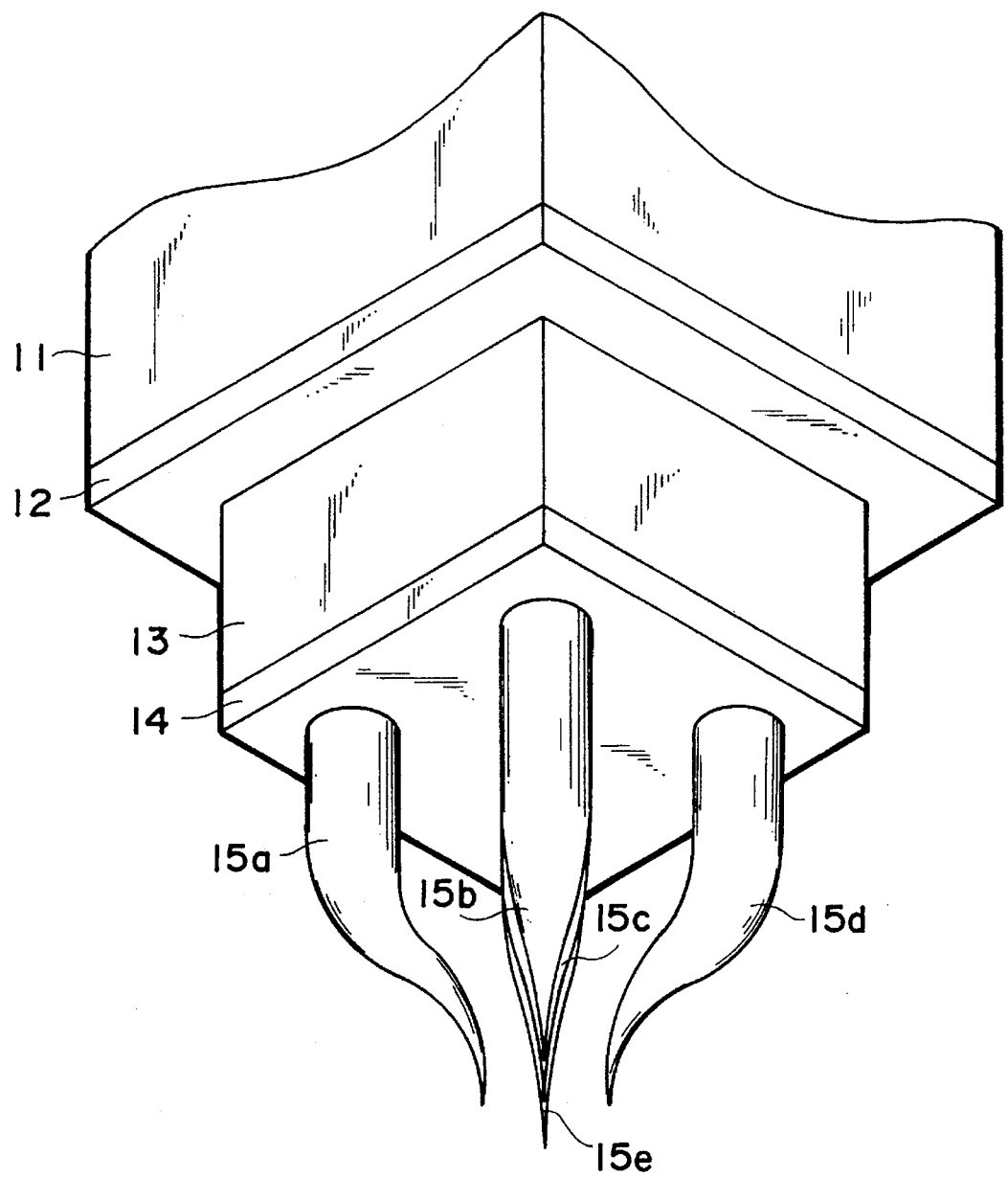
FIG. 4 is a perspective view of an E-O probe of the second embodiment of the present invention.

FIG. 4 is a perspective view to show the structure of an E-O probe of the second embodiment of the present invention.

The present embodiment is a modification in the shape of the electric needles 5a–5e shown in FIG. 1. This E-O probe comprises a transparent support member 11, a transparent electrode 12 fixed to the support member 11, an electrooptic member 13 fixed to the transparent electrode 12, a reflection film 14 fixed to the electrooptic member 13, and needlelike, conductive members 15a–15e fixed to the reflection film 14 at their ends (first end portions) as shown in the FIG. 4.

The lower end portions of the electric needles 15a–15e in the E-O probe are thinner than the upper end portions thereof and the distance between the electric needles 15 becomes shorter toward the lower ends. Further, the longitudinal direction of the lower end portions of the electric needles 15a–15e is made approximately perpendicular to the surface of the measured device. In other words, the longitudinal direction of the lower end portions (second end portions) of the electric needles 15a–15e is approximately perpendicular to reflection film 14.

Such an arrangement that the longitudinal direction of the lower end portions of the electric needles 15a–15e is made approximately perpendicular to the surface of the measured device (integrated circuit chip 112 shown in FIG. 2 or 3) can prevent interference with an electric field induced by neighboring elements (not shown) in the measured device (integrated circuit 112 shown in FIG. 2 or 3) and can permit the electric field induced at the lower end portions of the electric needles 15a–15e to be accurately detected with high spatial resolution.

Since the lower ends of the electric needles 15a–15e are also formed in an approximately same plane, similarly as the electric needles 5a–5e in FIG. 1, the in-plane distribution of potentials in a fine region in the measured object can be accurately measured.

According to the second embodiment as described above, the longitudinal direction of the lower end portions of the electric needles 15 is made approximately perpendicular to the surface of the measured device, whereby the interference can be prevented with the electric field induced by the potentials in the neighboring elements in the measured device and the potentials in the measured device can be detected with high spatial resolution.

Even if the E-O probe is brought into contact with the measured device under a strong force because of an operational error or the like during measurement of potentials in the measured device, a transverse stress exerted on the interface between the electric needles 15a–15e and a reflection film 14 to which the electric needles 15a–15e are fixed can be reduced as compared with the E-O probe of the first embodiment, whereby the electric needles 15a–15e can be prevented from breaking because of such an operational error or the like.

Third Embodiment

Figure 5:
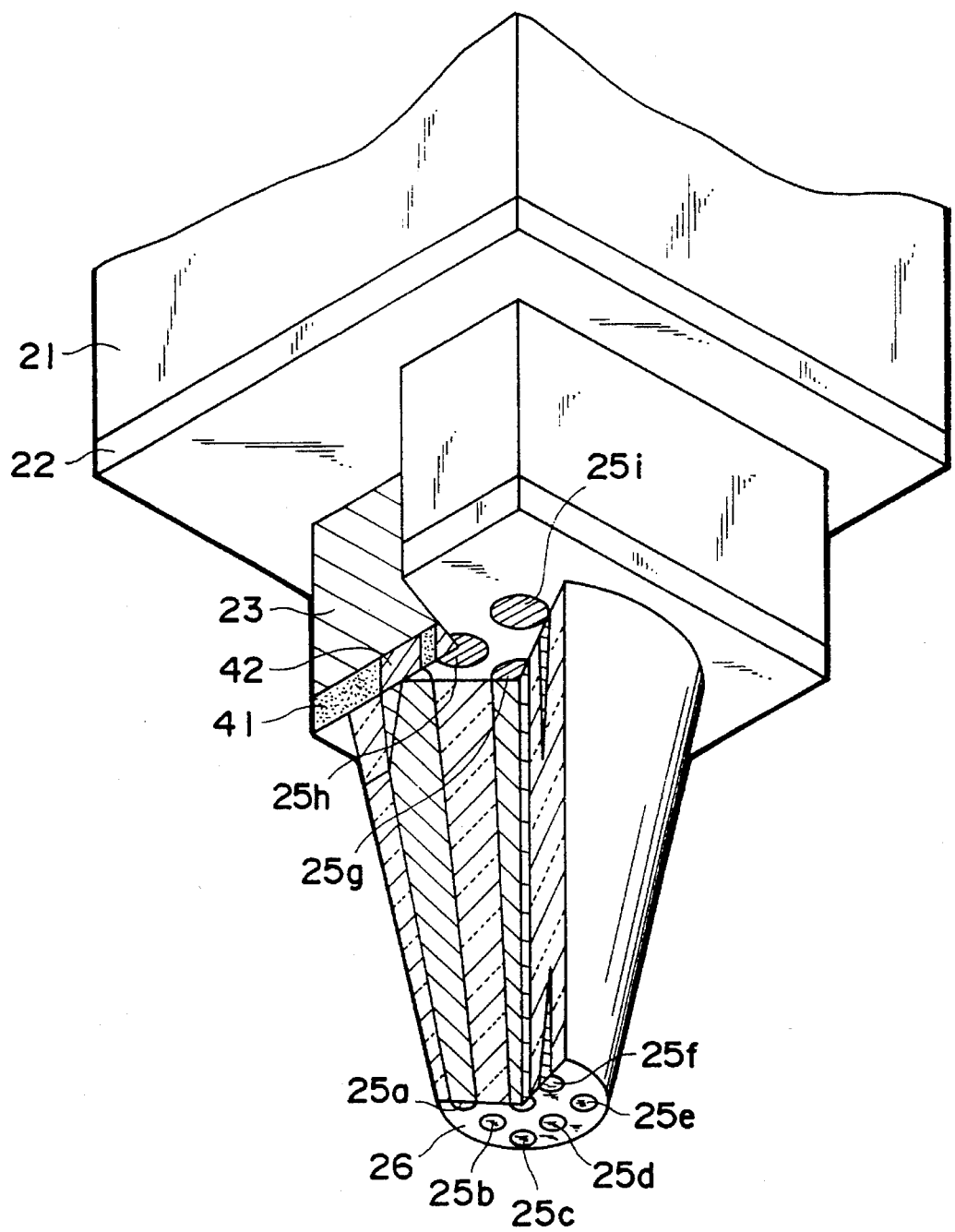
FIG. 5 is a perspective view of an E-O probe of the third embodiment of the present invention.

FIG. 5 is a perspective view, partly in vertical section, to show the structure of an E-O probe of the third embodiment of the present invention.

The present embodiment is a modification in the shape of the electric needles 5a–5e shown in FIG. 1. This E-O probe comprises a transparent support member 21, a transparent electrode 22 fixed to the support member 21, an electrooptic member 23 fixed to the transparent electrode 22, a light shield film 41 fixed to the electrooptic member 23, a reflection film 42 fixed to the electrooptic member 23, and needlelike, conductive members 25a–25i fixed to the reflection film 42 at their ends (first end portions) as shown in the FIG. 5.

The present embodiment is so arranged that the electric needles 5a–5e in FIG. 1 are replaced by electric needles 25a–25i in which a conductive material is mixed in core portions in a taper fiber plate shaped in a frustum of circular cone. The core portions to become the electric needles 25a–25i are buried in a clad portion 26 in the taper fiber plate. The light shield film 41 and reflection film 42 are formed on the lower surface of the electrooptic member 23 in place of the reflection film 4 in FIG. 1. Further, the bottom surface of the taper fiber plate is fixed to lower surfaces of the light shield film 41 and the reflection film 42.

The upper end face and lower end face of the taper fiber plate are polished, whereby the lower end faces of the electric needles 25a–25i are on a substantially same plane, which is such an arrangement that all the lower end faces of the electric needles 25a–25i can be located in the vicinity of or in contact with a measured surface of the measured device in parallel therewith.

In more details, if the lower end faces of the electric needles 25a–25i are located above the lower end surface of the clad portion 26, the lower end surface of the clad portion 26 is made in contact with the surface of the measured device whereby the electric needles 25a–25i can be located in the vicinity of the surface of the measured device with a clearance of a difference between the lower end surface of the clad portion 26 and the lower end faces of the electric needles 25a–25i. Accordingly, as shown in FIG. 8, this figure shows a special structure E-O probe illustrated in FIG. 5, the clearance described above is defined by a gap "d" between the lower end faces (reference level) of the electric needles 250a–250c and lower end surface of the clad portion 260, or between the lower end faces of the electric needles 250a–250c and a surface of an electrode EL of a measured device SM.

Further, in FIG. 5, if the lower end faces of the electric needles 25a–25i are located below the lower end surface of the clad portion 26, all the lower end faces of the electric needles 25a–25i can be located in contact with or in the vicinity of the surface of the measured device in parallel therewith.

It is of course that if the lower end surface of the clad portion 26 is coincident in height with the lower end faces of the electric needles 25, the electric needles 25 can be readily made uniformly in contact with the measured device by bringing the clad portion 26 into contact with the surface of the measured device. This type of E-O probe can be fabricated by a process comprising a step of forming an E-O probe including the needles 25a–25i buried in the clad portion 26, said needles 25a–25i having a first end portions and second end portions, wherein said first end portions are fixed to the reflection film 42; and a step of polishing a surfaces of the clad portion 26 and second end porions of the needles 25a–25i simultaneously.

Not only does the clad portion 26 mechanically reinforce the electric needles 25 of thin wires, but it also separates the electric needles 25 from each other without mutual contact. Further, similarly as in FIG. 1, the reflection film 42 is fixed to the upper end faces of the electric needles 25, while the light shield film 41 is fixed to the lower end surface of the electrooptic member 23 except for the surfaces where the reflection film 42 is fixed.

This arrangement can prevent the detection of light including information on potentials from the neighboring electric needles 25a–25i, when the laser light is made incident from above the support 21 to extract the information on the electric field induced in the electric needles 25a–25i, as light.

Figure 6:
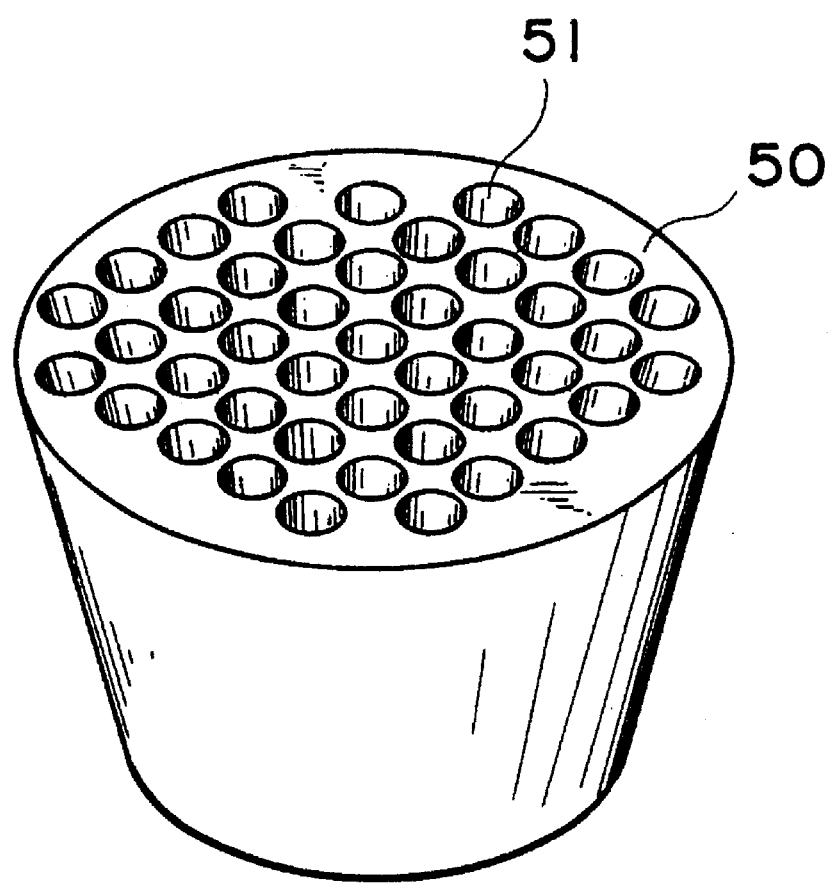
FIG. 6 is a perspective view of an E-O probe of the fourth embodiment of the present invention.

Although the present embodiment employed the taper fiber plate, the same effect can be enjoyed by any modification in which the conductive needles 25 are buried in an insulating medium or member (the clad portion 26 in FIG. 5). An example of such a modification is shown in FIG. 6. In this example, electric needles 25a–25i shown in FIG. 5 are so constructed that a conductive metal is deposited inside through holes 51 shown in FIG. 6 in a taper multichannel plate base (taper capillary plate base) 50 shaped in a frustum of circular cone made of an insulating material such as glass and having a plurality of vertical through holes 51.

In more detail, it may be formed in such a manner that the taper multichannel plate base 50 is set in a vacuum vessel (not shown), glass materials such as $GeO_2$ and $P_2O_5$ in the vapor phase are made to vertically flow while heating the base with an oxyhydrogen burner (not shown), and at the same time, a conductive metal Pb or Au is heated to be made to flow in the vapor phase, whereby conductive glass is deposited over inner walls of the through holes 51. The conductive electric needles can also be formed in the through holes 51 in the above manner.

Also, a value of resistance of the electric needles of the conductive glass or the like thus deposited can be changed by changing a mixture ratio of the glass materials for the multichannel plate base 50. Further, the deposition may be effected not only in the vapor phase but also in the liquid phase, and the glass materials are not always limited to $GeO_2$ and $P_2O_5$ as long as they can form the electric needles 25a–25i having conductivity.

According to the third embodiment as described above, the lower end surface of the taper fiber plate is polished, so that the lower ends of the electric needles 25 can be readily formed on the substantially same plane. In addition, since the electric needles 25a–25i are buried in the clad portion 26, the mechanical strength of the electric needles 25a–25i can be improved and the electric needles 25a–25i can be separated from each other without mutual contact. Further, the light shield film 41 is fixed to the lower end surface of the electrooptic member 23 except for the surfaces where the reflection film 42 is fixed, which can prevent the light including the information on potentials from the neighboring electric needles 25 from being detected.

It is noted that the light shield film 41 can also be applied to the E-O probes in the first and second embodiments.

Next described is a process for producing the electric needles 5a–5e in the E-O probe shown in FIG. 1.

FIGS. 7A–7D show production steps for the E-O probe electric needles 5a–5c in the first embodiment of the present invention to be formed on the lower surface of the reflection film 4 fixed to the electrooptic member 3.

Figure 7A:
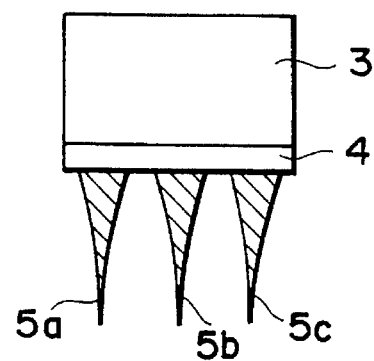
FIGS. 7A–7D are explanatory drawings to illustrate a process for producing the E-O probe of the first embodiment of the present invention.

First, as shown in FIG. 7A, the bottom surfaces of the electric needles 5a–5c preliminarily pin-pointed at the lower end portions are fixed to the lower surface of the reflection film 4. (first step)

Figure 7B:
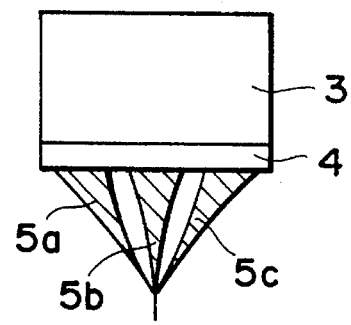
Figure 7C:
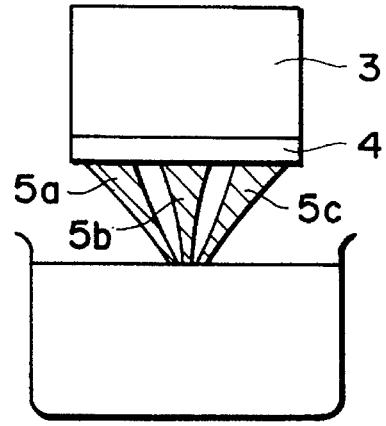

Next, the lower end portions of the electric needles 5a–5c are bundled into one as shown in FIG. 7B. (second step) Then, as shown in FIG. 7C, the bundled lower end portions of the electric needles 5a–5c are dipped in an etching solution to chemically remove the tip portions and to align the lower end positions of the electric needles 5a–5c. (third step)

Figure 7D:
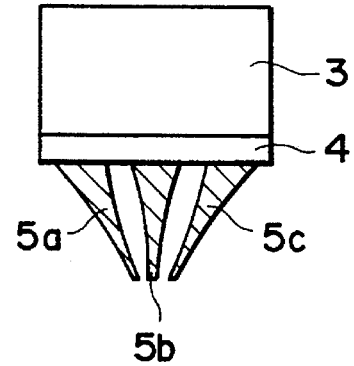

Thus, the E-O probe base is obtained with the electric needles 5a–5c converging toward the lower ends thereof and formed on the lower surface of the electrooptic member through the reflection film 4, as shown in FIG. 7D. The E-O probe shown in FIG. 1 is obtained by fixing this base to the support 1 through the transparent electrode 2.

Although the electric needles 5a–5c preliminarily pin-pointed toward the tip were employed in the above first step, this step may be replaced by such a step that small balls of a conductive material such as the metal solder are fixed on the lower surface of the reflection film 4 and thereafter, heating the conductive material, the balls are pulled downward to form the electric needles 5a–5c of fine wires. Also, the first step may be arranged in such a manner that a conductive adhesive with high viscosity is bonded to the lower surface of the reflection film 4 and thereafter part thereof is pulled downward to form the electric needles 5a–5c of fine wires.

The shape of the E-O probe electric needles 15 in the second embodiment can be achieved by mechanically processing the electric needles 5a–5c in the thus produced E-O probe base by means of cutting pliers or the like.

According to the present invention, as detailed above, the electric field corresponding to potentials in a fine region in the measured object is induced as enlarged in a broad region in the electrooptic member through the needlelike, conductive members (5a–5e, 15a–15e, 25a–25i), whereby a distribution of potentials in the fine region in the measured object (112, EL) can be measured, which was conventionally impossible because of the diffraction limit of light.

In addition, since the lower ends of the needlelike, conductive members (5a–5e, 15a–15e, 25a–25i) are formed on the substantially same plane, the needlelike, conductive members (5a–5e, 15a–15e, 25a–25i) can be set uniformly close to the fine region in the measured object, whereby the in-plane distribution of potentials in the fine region in the measured object can be accurately measured.

Further, since the needlelike, conductive members (25a–25i) are buried in the insulator (26, 260), the needlelike, conductive members (25a–25i) can not only be reinforced, but also be electrically insulated.

Further, forming the light shield film (41) on the surface of the electrooptic member (23) on which the reflection film (42) is formed but on portions where the one ends of the plural needlelike, conductive members (25a–25i) are not fixed to the said reflection film, the interference can be prevented with reflected light from the neighboring needlelike, conductive members (25a–25i) and the potentials in the measured object can be accurately measured.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.241626/1993 filed on Sep. 28, 1993 is hereby incorporated by reference.

What is claimed is:

1. An electro-optic voltage detector comprising:

an electrooptic member;

a reflection film formed on said electrooptic member;

a first needlelike member having a first end portion and a second end portion, wherein said first end potion of said first needlelike member is fixed to said reflection film; and a second needlelike member having a first end portion and a second end portion, wherein said first end portion of said second needlelike member is fixed to said reflection film, and wherein a first distance between said first end portion of said first needlelike member and said first end portion of second needlelike member is longer than a second distance between said second end portion of said first needlelike member and said second end portion of second needlelike member.

2. An electro-optic voltage detector according to claim 1, said electro-optic voltage detector comprising a transparent electrode formed on said electrooptic member, wherein said electrooptic member is arranged between said transparent electrode and said reflection film.

3. An electro-optic voltage detector according to claim 1, said electro-optic voltage detector comprising a support member formed on said electrooptic member.

4. An electro-optic voltage detector according to claim 1, wherein said second end portion of said first needlelike member is thinner than said first end potion of said first needlelike member.

5. An electro-optic voltage detector according to claim 1, wherein a longitudinal direction of said second end portion of said first needlelike member is perpendicular to said reflection film, and wherein a longitudinal direction of said second end portion of said second needlelike member is perpendicular to said reflection film.

6. An electro-optic voltage detector according to claim 1, said electro-optic voltage detector comprising an insulator member, wherein said first needlelike member and second needlelike member are buried in said insulator member.

7. An electro-optic voltage detector according to claim 6, said electro-optic voltage detector comprising a light shield film formed between said electrooptic member and said insulator member.

8. An electro-optic voltage detector according to claim 1, wherein said first needlelike member is made of a material containing solder.

9. An electro-optic voltage detector according to claim 8, wherein said electrooptic member is made of a material containing either one of ZnTe, $LiNbO_3$, BSO, GaAs, CdTe and $LiTaO_3$.

10. An electro-optic voltage detector according to claim 1, said electro-optic voltage detector comprising:

a main body;

a device-to-be measured support table attached to said main body, said device-to-be measured support table facing to said first and second needlelike members;

a movable stage attached to said main body for moving said first and second needlelike members related to said device-to-be measured support table;

an optical unit attached to said main body, said optical unit having:

a laser light source, a wave plate, a photodetector, a polarization beam splitter, wherein said laser light source, said wave plate and said polarization beam splitter are so arranged that an incident laser beam from said laser light source is made incident through said polarization beam splitter and said wave plate in a first direction; and wherein said wave plate, said photodetector and said polarization beam splitter are so arranged that a reflection laser beam from said wave plate, travelling in a second direction is reflected by said polarization beam splitter and is made incident on said photodetector;

a microscope unit attached to said main body, said microscope unit having an objective lens, wherein said objective lens is so arranged that said incident laser beam is made incident through said objective lens and is made incident on said reflection film; and wherein said objective lens is so arranged that said reflection laser beam reflected by said reflection film is made incident thorough said objective lens and is made incident thorough said wave plate in said second direction.

11. An electro-optic voltage detector according to claim 10, said electro-optic voltage detector comprising:

an oscilloscope electrically connected to said photodetector;

a signal converter electrically connected to said oscilloscope, wherein a photo intensity signal from said oscilloscope is converted to voltage signal developing in a selected area of an object to be measured with said signal converter.

12. An electro-optic voltage detector according to claim 10, wherein said optical unit further comprising a deflecting element for scanning said incident beam.

13. An E-O probe comprising:

an electrooptic member changing a refractive index thereof in accordance with an electric field applied thereto; and a plurality of needlelike, conductive members bases of which are fixed to said electrooptic member;

wherein each space on a side of said bases between said plurality of needlelike, conductive members is greater than each space on a side of tips between said needlelike, conductive members.

14. An E-O probe according to claim 13, wherein the tips of said plurality of needlelike, conductive members are located on a substantially same plane.

15. An E-O probe according to claim 14, wherein said plurality of needlelike, conductive members are buried in a retaining portion made of an insulator.

16. An E-O probe according to claim 15, wherein a light reflection film is interposed in portions where the bases of said plurality of needlelike, conductive members are fixed to said electrooptic member; and wherein a light shield film is formed on exposed surfaces around fixed surfaces of said bases.

* * * * *